US007081210B2

(12) United States Patent
Hirai et al.

(10) Patent No.: US 7,081,210 B2
(45) Date of Patent: Jul. 25, 2006

(54) ORGANIC SEMICONDUCTOR COMPOSITION

(75) Inventors: Katsura Hirai, Hachioji (JP); Mitsuhiro Fukuda, Chofu (JP)

(73) Assignee: Konica Minolta Holdings, Inc., Tokyo (JP)

( * ) Notice: Subject to any disclaimer, the term of this patent is extended or adjusted under 35 U.S.C. 154(b) by 0 days.

(21) Appl. No.: 10/511,353

(22) PCT Filed: Apr. 16, 2003

(86) PCT No.: PCT/JP03/04824

§ 371 (c)(1), (2), (4) Date: Oct. 12, 2004

(87) PCT Pub. No.: WO03/089515

PCT Pub. Date: Oct. 30, 2003

(65) Prior Publication Data

US 2005/0148179 A1   Jul. 7, 2005

(30) Foreign Application Priority Data

Apr. 22, 2002   (JP) ............... 2002-119142

(51) Int. Cl. *H01L 29/12* (2006.01)

(52) U.S. Cl. ............................... 252/62.3 Q

(58) Field of Classification Search ........ 257/40; 438/99; 252/62.3 Q
See application file for complete search history.

(56) References Cited

U.S. PATENT DOCUMENTS

| 4,093,562 | A | * | 6/1978 | Kishimoto ............... 252/511 |
| 4,590,541 | A | * | 5/1986 | Takahashi et al. ........ 361/527 |
| 5,500,537 | A | * | 3/1996 | Tsumura et al. ............ 257/40 |
| 6,107,117 | A | * | 8/2000 | Bao et al. .................. 438/99 |
| 6,238,790 | B1 | * | 5/2001 | Smith et al. .............. 428/379 |
| 6,507,026 | B1 | * | 1/2003 | Ikeda et al. ........... 250/370.09 |
| 6,541,300 | B1 | * | 4/2003 | Chowdhuri et al. ......... 438/99 |
| 6,621,099 | B1 | * | 9/2003 | Ong et al. .................. 257/40 |
| 6,626,566 | B1 | * | 9/2003 | Holmes et al. ............. 257/59 |
| 2005/0104060 | A1 | * | 5/2005 | Halik et al. ................ 257/40 |

FOREIGN PATENT DOCUMENTS

| EP | 0 488 321 A1 | * | 11/1991 |
| JP | 51-106148 | * | 9/1976 |
| JP | 3-273687 | * | 12/1991 |
| JP | 6-167828 | * | 6/1994 |

* cited by examiner

*Primary Examiner*—Evan Pert
(74) *Attorney, Agent, or Firm*—Lucas & Mercanti, LLP

(57) ABSTRACT

Disclosed is an organic semiconductor composition containing particles and an organic semiconducting compound combining with the particles.

13 Claims, 6 Drawing Sheets

ORGANIC SEMICONDUCTOR COMPOSITION

FIELD OF THE INVENTION

The present invention relates to an organic semiconductor composition, an organic thin-film transistor, a semiconductor element such as a photosensor, and their manufacturing method.

PRIOR ART

In recent years, an organic thin-film transistor employing an organic semiconducting compound as a semiconductor channel has been studied. The organic semiconducting compound is easy in processing and high affinity to a plastic sheet support, as compared with an inorganic semiconducting compound, and therefore, is preferred in its application to a thin-film device.

There is, for example, description in Japanese Patent O.P.I. Publication Nos. 9-232589 and 7-206599 that an orientation film increases carrier mobility in an organic semiconductor layer. Further, there is proposed technique in WO 0079617 that mobility in an organic semiconductor channel is increased by orientation treatment of the semiconductor which employs mesomorphism produced on heating a semiconducting polymer to not less than the boiling point and an adjoining orientation film. However, these require an additional process of forming an orientation film adjacent to the semiconductor layer, which complicates constitution of an semiconductor element.

A modified FET structure has been proposed in Japanese Patent O.P.I. Publication No. 2000-260999, which employs an organic-inorganic hybrid material as a semiconductor channel. Typically, a semiconductor element with high mobility is proposed which employs a self-organizing semiconductor material, which actually requires complex processes to prepare the semiconductor material.

An object of the invention is to provide an organic semiconductor composition which can provide a layer with high mobility capable of being formed by a simple procedure without an orientation process such as an orientation film formation, and to provide a semiconductor element such as an organic thin-film transistor or a photosensor, each employing the organic semiconductor composition.

DISCLOSURE OF THE INVENTION

The above object of the invention can be attained by one of the following constitutions:

(1) An organic semiconductor composition comprising particles and an organic semiconducting compound combining with the particles.

(2) The organic semiconductor composition of item (1) above, wherein the particles are metal particles.

(3) The organic semiconductor composition of item (1) above, wherein the organic semiconducting compound combines with the particles through a sulfide group, a disulfide group, a carboxyl group, a sulfonic acid group, a sulfinic acid group, a phosphonic acid group, or a phosphate group.

(4) The organic semiconductor composition of item (3) above, wherein the organic semiconducting compound combines with the particles through a sulfide group.

(5) The organic semiconductor composition of item (1) above, wherein the organic semiconducting compound is a π-conjugated polymer or oligomer.

(6) The organic semiconductor composition of item (5) above, wherein the π-conjugated polymer or oligomer is a polythiophene derivative.

(7) The organic semiconductor composition of item (6) above, wherein the polythiophene derivative is a regioregular poly(3-alkylthiophene).

(8) The organic semiconductor composition of item (7) above, wherein the alkyl group of the regioregular poly(3-alkylthiophene) is an alkyl group having a carbon atom number of from 4 to 15.

(9) The organic semiconductor composition of item (7) above, wherein the regioregular poly(3-alkylthiophene) combining with the particles is dispersed in a solvent.

(10) The organic semiconductor composition of item (7) above, wherein the solvent can dissolve the regioregular poly(3-alkylthiophene).

(11) The organic semiconductor composition of item (7) above, wherein the regioregular poly(3-alkylthiophene) combining with the particles is a mixture of first particles, with which poly(5-substituted 3-alkylthiophene) combines through the substituent of the 5-position, and second particles, with which poly(2-substituted 3-alkylthiophene) combines through the substituent of the 2-position.

(12) The organic semiconductor composition of item (11) above, wherein the first particles, with which poly(5-substituted 3-alkylthiophene) combines through the substituent of the 5-position, are dispersed in a first solvent to obtain a first dispersion, second particles, with which poly(2-substituted 3-alkylthiophene) combines through the substituent of the 2-position, are dispersed in a second solvent to obtain a second dispersion, and both dispersions are mixed.

(13) The organic semiconductor composition of item (5) above, wherein the π-conjugated polymer or oligomer is a polyporphyrin derivative.

(14) The organic semiconductor composition of item (13) above, wherein the polyporphyrin derivative is poly(imidazolylporphyrin-metal complex).

(15) A semiconductor element which is a photosensor comprising an organic semiconductor layer and two or more electrodes contacting it or an organic thin-film transistor comprising a support, a gate electrode and a gate insulation layer provided on the support, an organic semiconductor layer provided on the gate insulation layer, and a source electrode and a drain electrode each contacting the organic semiconductor layer, wherein the organic semiconductor layer contains an organic semiconductor composition comprising particles and an organic semiconducting compound combining with the particles.

(16) The semiconductor element of item (15) above, wherein the particles are metal particles.

(17) The semiconductor element of item (15) above, wherein the organic semiconducting compound combines with the particles through a sulfide group, a disulfide group, a carboxyl group, a sulfonic acid group, a sulfinic acid group, a phosphonic acid group, or a phosphate group.

(18) The semiconductor element of item (17) above, wherein the organic semiconducting compound combines with the particles through a sulfide group.

(19) The semiconductor element of item (15) above, wherein the organic semiconducting compound is a π-conjugated polymer or oligomer.

(20) The semiconductor element of item (19) above, wherein the π-conjugated polymer or oligomer is a polythiophene derivative.

(21) The semiconductor element of item (20) above, wherein the polythiophene derivative is a regioregular poly(3-alkylthiophene).

(22) The semiconductor element of item (21) above, wherein the alkyl group of the regioregular poly(3-alkylthiophene) is an alkyl group having a carbon atom number of from 4 to 15.

(23) The semiconductor element of item (21) above, wherein the regioregular poly(3-alkylthiophene) combining with the particles is dispersed in a solvent.

(24) The semiconductor element of item (23) above, wherein the solvent can dissolve the regioregular poly(3-alkylthiophene).

(25) The semiconductor element of item (21) above, wherein the regioregular poly(3-alkylthiophene) combining with the particles is a mixture of first particles, with which poly(5-substituted 3-alkylthiophene) combines through the substituent of the 5-position, and second particles, with which poly(2-substituted 3-alkylthiophene) combines through the substituent of the 2-position.

(26) The semiconductor element of item (25) above, wherein the first particles, with which poly(5-substituted 3-alkylthiophene) combines through the substituent of the 5-position, are dispersed in a first solvent to obtain a first dispersion, second particles, with which poly(2-substituted 3-alkylthiophene) combines through the substituent of the 2-position, are dispersed in a second solvent to obtain a second dispersion, and both dispersions are mixed.

(27) The semiconductor element of item (19) above, wherein the π-conjugated polymer or oligomer is a polyporphyrin derivative.

(28) The semiconductor element of item (27) above, wherein the polyporphyrin derivative is poly(imidazolylporphyrin-metal complex).

(29) A manufacturing method of an organic semiconductor composition comprises the steps of:

dispersing, in a solvent, particles with which an organic semiconducting monomer having a linkage group combines through the linkage group to obtain a dispersion; and adding to the dispersion a solution of an organic semiconducting dimer, whereby the monomer and the dimer are located on the surface of the particles and a polymer of the monomer is formed between the particles.

(30) The manufacturing method of item (29) above, wherein the particles are metal particles.

(31) The manufacturing method of item (29) above, wherein the organic semiconducting monomer combines with the particles through a sulfide group, a disulfide group, a carboxyl group, a sulfonic acid group, a sulfinic acid group, a phosphonic acid group, or a phosphate group.

PREFERRED EMBODIMENT OF THE INVENTION

Figure 1:
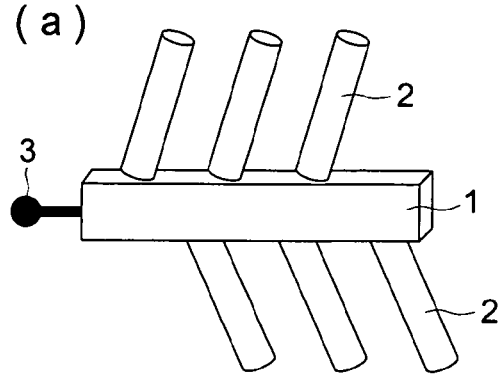
FIG. 1 shows a schematic view of the chemical structure of poly(3-alkylthiophene) used in the invention.
Figure 1:
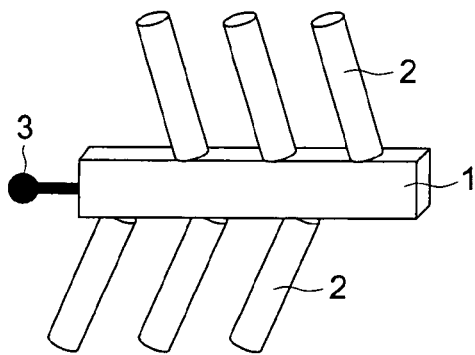
Figure 1:
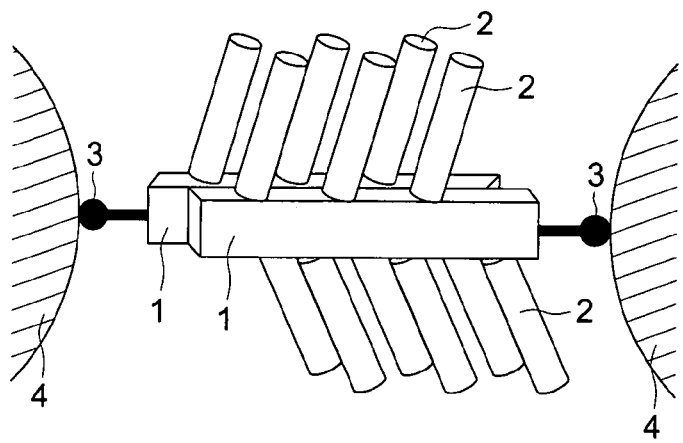

The present invention will be explained in detail below.

The organic semiconductor composition of the invention is characterized in that it comprises an organic semiconducting compound combining with particles.

Although known organic semiconducting compounds can be used, the organic semiconducting compound is preferably a p-conjugated polymer or oligomer, and more preferably polythiophene derivative. The polythiophene derivative is preferably a derivative (hereinafter also referred to simply as a regioregular poly(3-alkylthiophene) derivative) comprising a regioregular poly(3-alkylthiophene) structure, and the alkyl group in the regioregular poly(3-alkylthiophene) derivative has a carbon number of preferably 4 to 15.

The particles are preferably metal particles. The metal particles combine with the organic semiconductor compound preferably through a sulfide group, a disulfide group, a carboxyl group, a sulfonic acid group, a sulfinic acid group, a phosphonic acid group or a phosphate group, and more preferably through sulfide group.

The organic semiconductor composition of the invention is preferably an organic semiconductor dispersion in which the particles with which the organic semiconducting compound combines are dispersed in a solvent. When an organic semiconductor layer is formed from the organic semiconductor dispersion, the particles are self-organized in a casting process to form an alignment structure, preferably a closest packing (hexagonal packing) structure, resulting in formation of an alignment structure of the organic semiconducting, which can increase carrier mobility without employing an orientation layer. It is preferred in the organic semiconductor composition of the invention that the regioregular poly(3-alkylthiophene) combining with the particles is dispersed in a solvent. The solvent is preferably a solvent capable of dissolving the regioregular poly(3-alkylthiophene).

Further, in the organic semiconductor composition of the invention, the regioregular poly(3-alkylthiophene) combining with the particles is preferably a mixture of first particles, with which poly(5-substituted 3-alkylthiophene) combines through the substituent of the 5-position, and second particles, with which poly(2-substituted 3-alkylthiophene) combines through the substituent of the 2-position. The mixture is obtained by the steps of dispersing, in a first solvent, the first particles, with which poly(5-substituted 3-alkylthiophene) combines through the substituent of the 5-position to obtain a first dispersion, dispersing, in a second solvent, second particles, with which poly(2-substituted 3-alkylthiophene) combines through the substituent of the 2-position to obtain a second dispersion, and then mixing the both dispersions.

The semiconductor element of the invention comprises an organic semiconductor layer containing the organic semiconductor composition of the invention and two or more electrodes contacting the organic semiconductor layer. The semiconductor element of the invention is preferably used as a photosensor.

The semiconductor element of the invention comprises an organic semiconductor layer containing the organic semiconductor composition of the invention and two or more electrodes contacting the organic semiconductor layer.

The organic thin-film transistor of the invention comprises a support, a gate electrode and a gate insulation layer provided on the support, a semiconductor channel provided on the gate insulation layer, and a source electrode and a drain electrode each contacting the semiconductor channel, wherein the semiconductor channel contains the organic semiconductor composition of the invention.

Next, the organic semiconducting compound in the invention will be explained.

Organic Semiconducting Compounds

As the organic semiconducting compounds, known π-conjugated polymers or oligomers as described later are used Examples of the organic semiconducting compounds include polypyrroles such as polypyrrole, poly(N-substituted pyrrole), poly(3-substituted pyrrole), and poly(3,4-disubstituted pyrrole); polythiophenes such as polythiophene, poly(3-substituted thiophene), poly(3,4-disubstituted thiophene), and polybenzothiophene; poly (porphyrin) such as polyporphyrin, and poly (imidszolylporphyrin)-metal complex; polyisothianaphthenes such as polyisothianaphthene; polythienylenevinylenes such as polythienylenevinylene; poly (p-phenylenevinylenes) such as poly(p-phenylenevinylene); polyanilines such as polyaniline, poly(N-substituted aniline), poly(3-substituted aniline), and poly(2,3-substituted aniline); polyacetylnenes such as polyacetylene; polydiacetylens such as polydiacetylene; polyazulenes such as polyazulene; polypyrenes such as polypyrene; polycarbazoles such as polycarbazole and poly(N-substituted carbazole), polyselenophenes such as polyselenophene; polyfurans such as polyfuran and polybenzofuran; poly(p-phenylenes) such as poly(p-phenylene); polyindoles such as polyindole; polypyridazines such as polypyridazine; polyacenes such as naphthacene, pentacene, hexacene, heptacene, dibenzopentacene, tertabenzopentacene, pyrene, dibenzopyrene, chrysene, perylene, coronene, terylene, ovalene, quoterylene, and circumanthracene; derivatives (such as triphenodioxazine, triphenodithiazine, hexacene-6,15-quinone) in which some of carbon atoms of polyacenes are substituted with atoms such as N, S, and O or with a functional group such as a carbonyl group; polymers such as polyvinyl carbazoles, polyphenylene sulfide, and polyvinylene sulfide; and polycyclic condensation products described in Japanese Patent O.P.I. Publication No. 11-195790.

Further, oligomers having repeating units in the same manner as in the above polymers, for example, thiophene hexamers including α-sexithiophene, α,ω-dihexyl-α-sexithiophene, α,ω-dihexyl-α-quiinquethiophene, and α,ω-bis(3-butoxypropyl)-α-sexithiophene, or styrylbenzene derivatives, can be suitably employed. Further, listed are metallophthalocyanines such as copper phthalocyanine, and fluorine-substituted copper phthalocyanines described in Japanese Patent O.P.I. Publication No. 11-251601; tetracarboxylic acid diimides of condensed ring compounds including naphthalene tetracarboxylic acid imides such as naphthalene 1,4,5,8-teracarboxylic acid diimide, N,N'-bis(4-trifluoromethylbenzyl)naphthalene 1,4,5,8-tretracarboxylic acid diimide, N,N'-bis(1H,1H-perfluoroctyl)naphthalene 1,4,5,8-tetracarboxylic acid diimide derivatives, N,N'-bis (1H,1H-perfluorobutyl)naphthalene 1,4,5,8-tetracarboxylic acid diimide derivatives, N,N'-dioctylnaphthalene 1,4,5,8-tetracarboxylic acid diimide derivatives, and naphthalene 2,3,6,7-tetracarboxylic acid diimides, and anthracene tetracarbocylic acid diimides such as anthracene 2,3,6,7-tetracarboxylic acid diimides; fullerenes such as $C_{60}$, $C_{70}$, $C_{76}$, $C_{78}$, and $C_{84}$; carbon nanotubes such as SWNT; and dyes such as merocyanines and hemicyanines. Further, employed as other organic semiconducting compounds may be organic molecular complexes such as a tetrathiafulvalene (TTF)-tetracyanoquinodimethane (TCNQ) complex, a bisethylene-tetrathiafulvalene (BEDTTTF)-perchloric acid complex, a BEDTTTF-iodine complex, and a TCNQ-iodine complex. Still further, employed may be σ conjugated polymers such as polysilane and polygermane, as well as organic-inorganic composite materials described in Japanese Patent O.P.I. Publication No. 2000-260999.

Of these π conjugated compounds, preferably employed is at least one selected from the group consisting of oligomers which have thiophene, vinylene, thienylenevinylene, phenylenevinylene, p-phenylene, their substitution product or at least two kinds thereof as a repeating unit and have a repeating unit number n of from 4 to 10, polymers which have the same unit as above and a repeating unit number n of at least 20, and condensed polycyclic aromatic compounds such as pentacene. Materials are preferred in which form stereo-regular structure by incorporating a substituent such as alkyl having a carbon atom number of from 4 to 15 in at least one portion of the repeating unit. Incorporation of a substituent such as alkyl can increase solubility to an organic solvent of organic semiconducting compounds, and give regularity to high order structure of the polymer from which organic semiconductor layer is formed.

Of the organic semiconducting compounds in the invention, the preferred is a regioregular poly(3-alkylthiophene). In the regioregular homopolymer of 3-alkylthiophene monomers, the orientation of the alkyl group (R group) on a given thiophene moiety is regular with respect to the adjacent thiophene moieties on the polymer chain. That is, the alkyl group is positioned on the thiophene moieties such that for two given adjacent thiophene moieties in the polymer backbone, only one alkyl group is oriented in the space between the two thiophene moieties. Most of the thiophene moieties in the polymer have an alkyl group with this regular orientation. However, regioregular 3-alkylthiophene polymers (or oligomers or their derivatives) wherein at least 95% of the thiophene moieties have alkyl groups with such an orientation are contemplated as suitable.

In the regioregular 3-alkylthiophene polymer, the alkyl group (R) has a carbon atom number of from 4 to 15. The alkyl group having a carbon atom number less than 4 reduces solubility to an organic solvent, and the alkyl group having a carbon atom number exceeding 15 tends to make the polymer structure less regular. The number of the thiophene moieties in the polymer is from 2 to 50, and preferably from 4 to 15. A mixture of polymers having different thiophene moiety numbers, for example, a mixture of a polymer having a thiophene moiety number of from 4 to 6 with a polymer having a thiophene moiety number of from 7 to 15 is preferred.

The organic semiconducting compound in the invention is a compound having in at least one end of the molecule a substituent through which the compound is capable of combining with particles. Examples of such a substituent include a sulfide group, a disulfide group, a carboxyl group, a sulfonic acid group, a sulfinic acid group, a phosphonic acid group, and a phosphate group. Among them, a sulfide group is preferred. In the case where such a compound is combined with metal particles of a metal such as gold, silver or platinum, for example, an organic compound having in the molecular end a group such as a thiol group, a methylthio group, a mercaptothio group (—S—SH), a methylmercaptothio group (—S—SCH₃) or an acetylthio group (—SAc) is combined with the particles through a sulfido linkage derived from the group. Metal particles may be combined with dimmers or multimers in which monomers are combined through a disulfido linkage.

The organic semiconducting compound in the invention is preferably a regioregular poly(3-alkylthiophene) combined with particles. As the regioregular poly(3-alkylthiophene), a combination of poly(3-alkylthiophene) represented by the following formula (1), and poly(3-alkylthiophene) represented by the following formula (2) are preferably used. The poly(3-alkylthiophene) of formula (1) has, in the 5-position of the thiophene moiety of the molecular end, a substituent through which the polymer is capable of being combined with particles, and the poly(3-alkylthiophene) of formula (2) has, in the 2-position of the thiophene moiety of the molecular end, a substituent through which the polymer is capable of being combined with particles.

Formula (1)

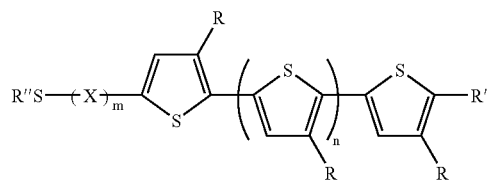

Formula (2)

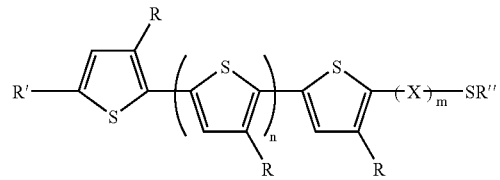

In the above formulae, R represents a substituted or unsubstituted alkyl group having a carbon atom number of from 4 to 15; R' represents a hydrogen atom or a substituent, the substituent being preferably a substituted or unsubstituted alkyl group, and more preferably a methyl group; R" represents a hydrogen atom, a methyl group, an acetyl group, a mercapto group, or a methylmercapto group; n is an integer of from 2 to 50; x represents a divalent linkage group, preferably an alkylene group or an arylene group, and more preferably a methylene group, an ethylene group, or a propylene group; and m represents 0 or 1.

When the poly(3-alkylthiophene) represented by formula (1) is illustrated as shown in FIG. 1(a), the poly(3-alkylthiophene) represented by formula (2) can be illustrated as shown in FIG. 1(b). Accordingly, when a combination of poly(3-alkylthiophene) represented by formula (1), and poly(3-alkylthiophene) represented by formula (2) are preferably used, the organic semiconducting composition of the invention is considered to be illustrated as shown in FIG. 1(c).

In FIGS. 1(a), 1(b), and 1(c), numerical number 1 represents a π conjugate plane comprised of thiophene nuclei, numerical number 2 represents an alkyl group R, numerical number 3 represents a linkage represented by an SH group through which the polymer combines with particles, and numerical number 4 represents particles represented by gold.

Exemplified compounds of the poly(3-alkylthiophene) will be listed below, but the invention is not limited thereto.

1.

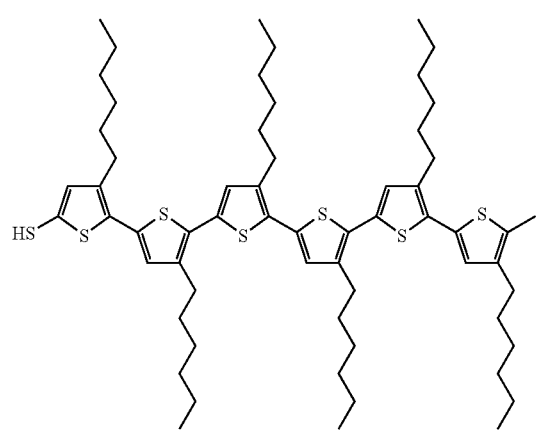

2.

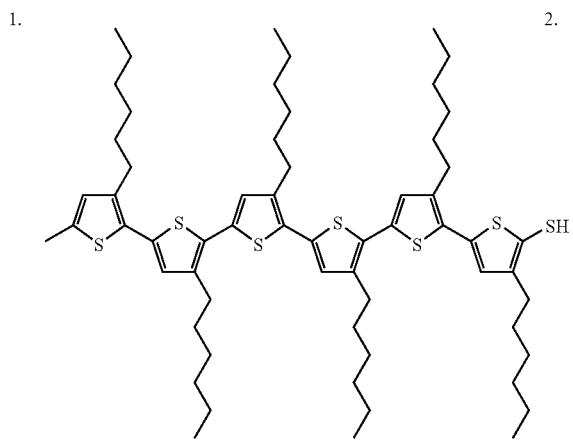

-continued
3.
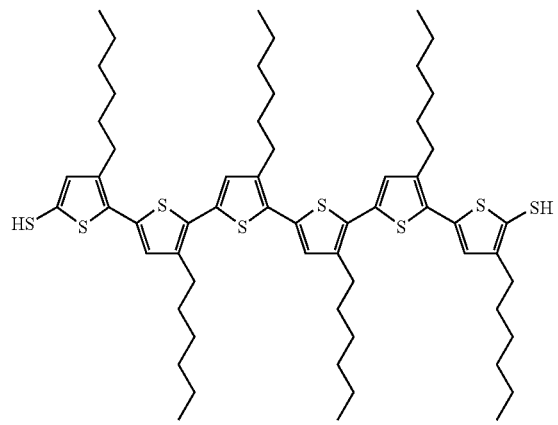
4.
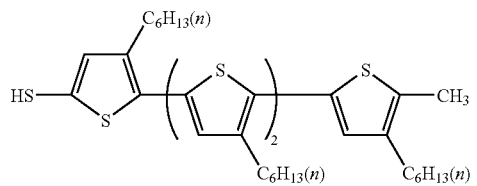
5.
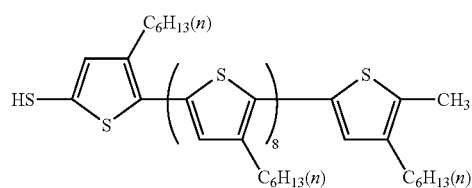
6.
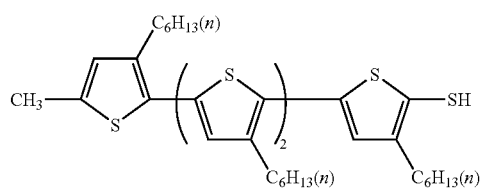
7.
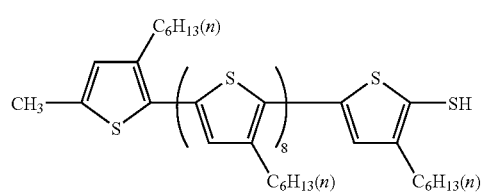
8.
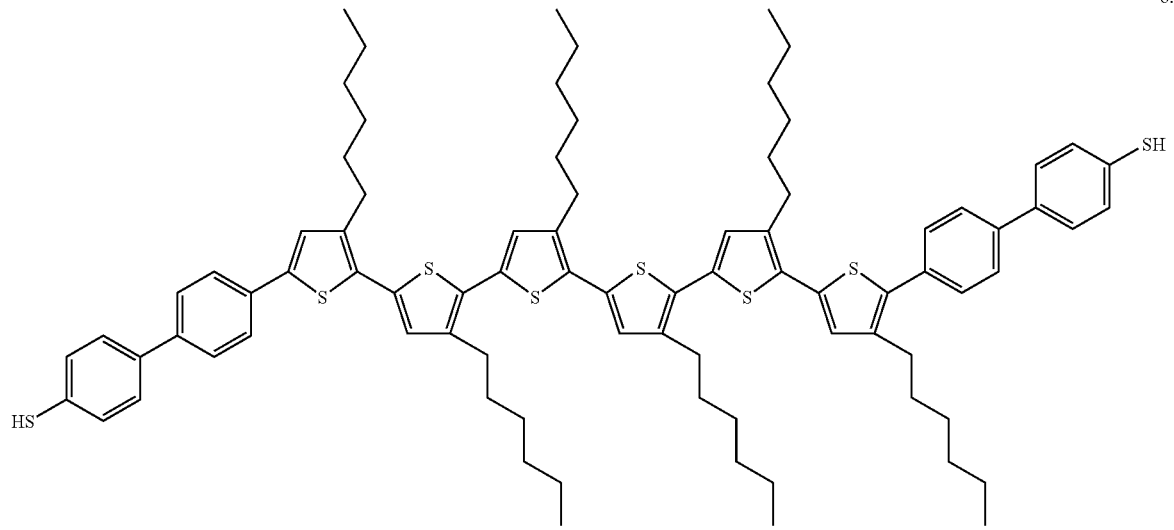

-continued

9.

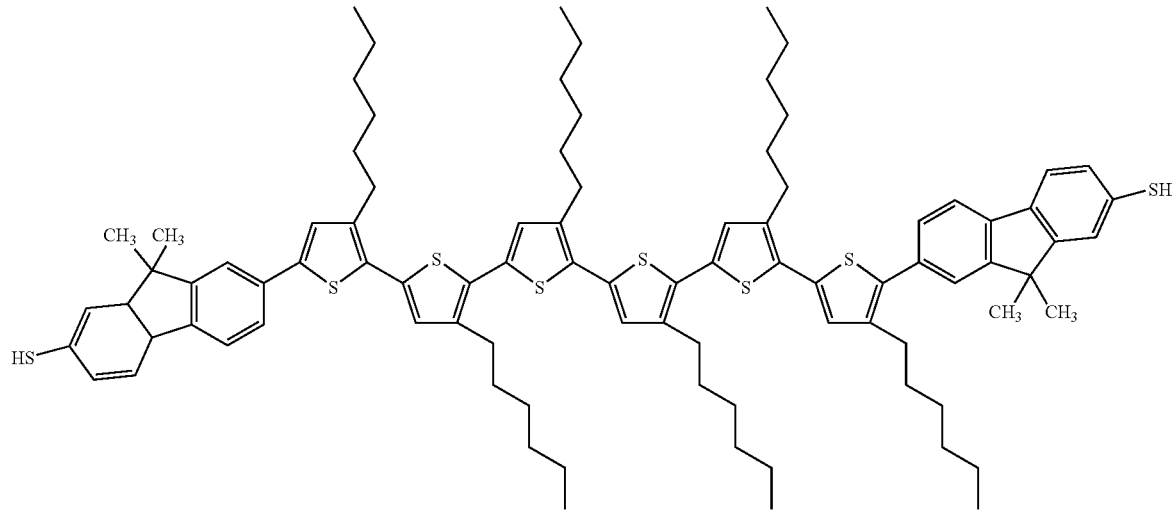

The manufacturing method of an organic semiconductor composition comprises the steps of dispersing, in a solvent, particles with which an organic semiconducting monomer having a linkage group combines through the linkage group to obtain a dispersion; and adding to the dispersion a solution of an organic semiconducting dimer, whereby the monomer and the dimer are located on the surface of the particles and a polymer of the monomer is formed between the particles.

Another organic semiconducting compound used in the invention is a porphyrin derivative disclosed in Japanese Patent O.P.I. Publication Nos. 2001-25388, 2001-213883, and 2001-81091, and preferably a poly(imidazolylporphyrin-metal complex) disclosed in Japanese Patent O.P.I. Publication No. 2001-213883, which contains an imidazolylporphyrin-metal complex as a monomer unit.

Figure 8:
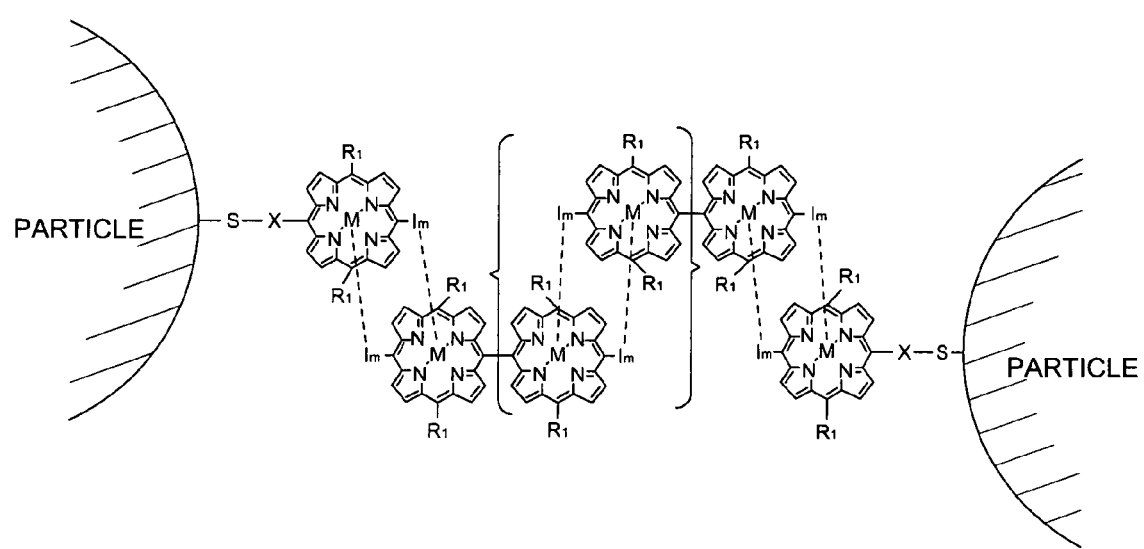
FIG. 8 shows a schematic view of the structure of poly(porphyrin) self-organized between particles.

In the invention, a manufacturing method of poly(porphyrin) with which particles combine comprises the steps of dispersing, in a solvent, particles with which an imidazolylporphyrin monomer (for example, Compound P-1 as shown below) having a linkage group combines through the linkage group to obtain a dispersion, and adding to the dispersion a solution of an imidazolylporphyrin dimer (for example, Compound P-2 as shown below) having a linkage group dimer, whereby the monomer and the dimer are located on the surface of the particles and poly(porphyrin) is formed between the particles. Another manufacturing method comprises the steps of providing a solution of poly(porphyrin), which has been obtained in advance by combining an imidazolylporphyrin monomer (for example, Compound P-1 as shown below), having a linkage group capable of combining with particles, with the both ends of a polyporphyrin precursor containing an imidazolylporphyrin dimer (for example, Compound P-2 as shown below), and then combining the resulting polyporphyrin with particles. These methods form a one-dimensional conducting path comprised of poly(porphyrin) self-organized between the particles. The structure of the poly(porphyrin) self-organized between the particles is shown in FIG. 8. In FIG. 8, $R_1$ represents an alkyl group (for example, methyl, ethyl or propyl) or an aryl group (for example, phenyl or naphthyl); M represents Zn, Ga, Fe or Co; and X represents an arylene group (for example, phenylene) or an alkylene group (for example, methylene, ethylene or propylene). A synthetic method or orientation method of the poly(porphyrin) above is described in detail in Japanese Patent O.P.I. Publication Nos. 2001-253883 and 2001-213883.

Compound P-1

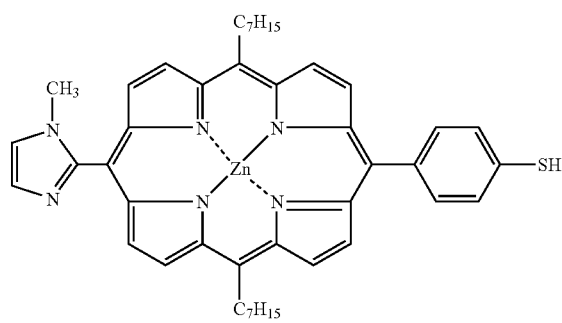

-continued
Compound P-2
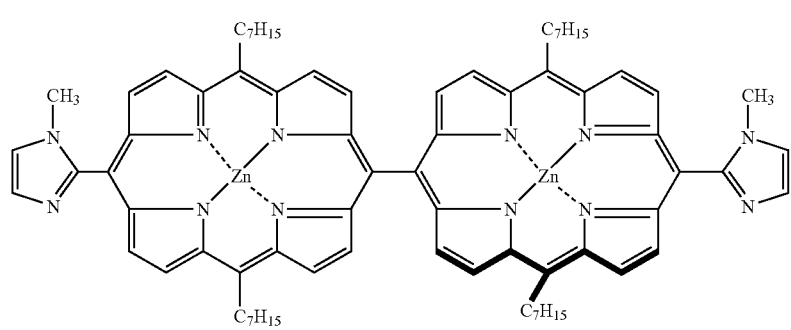
Exemplified compounds of the organic semiconducting compounds other than porphyrin derivatives (polyporphyrin derivatives) or poly(3-alkylthiophene) will be listed below.
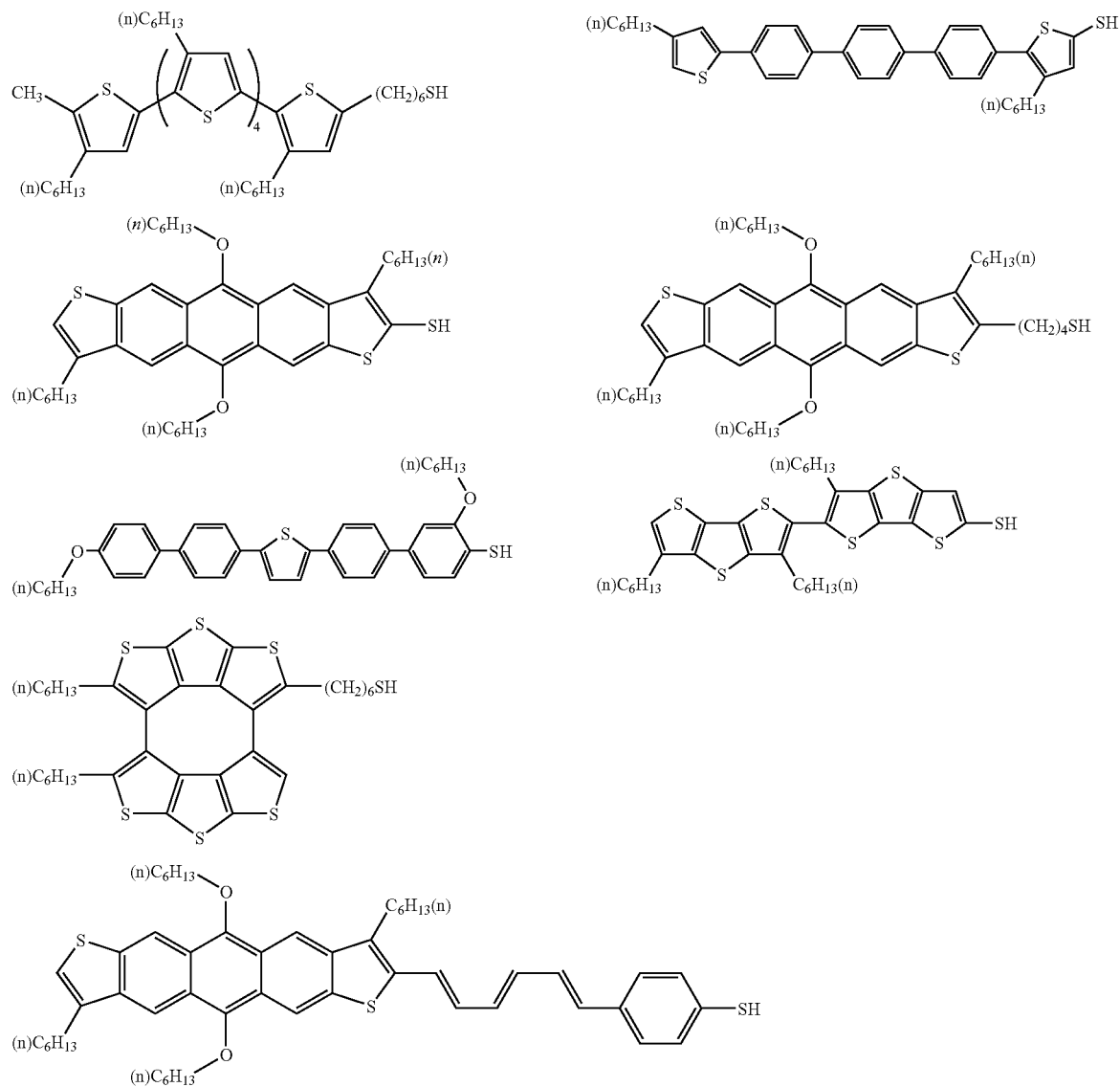

-continued

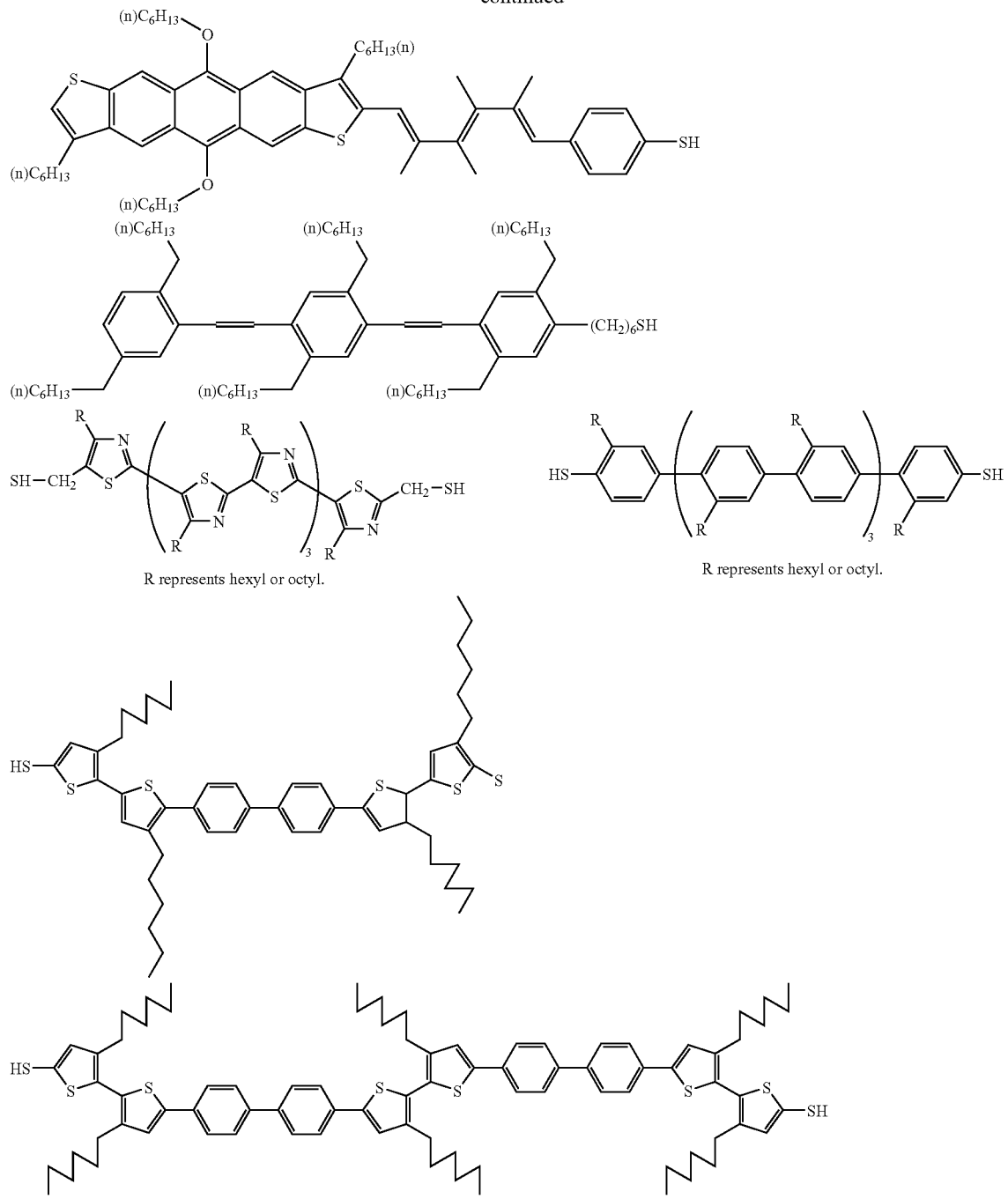

In order to incorporate in the organic semiconducting compound a linkage through which the compound combines with particles, various methods known in the art can be applied. A method incorporating an SH group into an aromatic ring end is disclosed in, for example, J. Organic. Chem.; EN, 60, 7, 2082–2091 (1995), J. Amer. Chem. Soc.; EN, 116, 26, 11985–11989 (1994), Synthesis; EN, 9, 751–755 (1983), and J. Chem. Soc. Perkin Trans. 1; EN, 187–194 (1987).

A synthetic method of sexithiophene, one of the most preferred compound as the organic semiconducting compound in the invention, is described in Justus Liebigs Ann. Chem.; 546; 1941, 180, 194 (synthesis from iodothiophene); Mol. Cryst. Liq. Cryst.; EN; 167; 1989; 227–232 (synthesis from dibromothiophene and bithiophene magnesium bromide); J. Organic. Chem., EN; 59; 16; 1994; 4630–4636 (employing homo-coupling of terthiophene in the presence of thallium catalyst); and Heterocycles; EN; 26; 7; 1987; 1793–1796 (employing homo-coupling of bromoterthiophene in the presence of catalyst, $NiCl_2$).

In a molecule, which has a π-electron structure, S positioned at the molecular end as a linkage group and alkylene intervening between them, incorporation of SH into the alkylene end of the molecule is described in J. Amer. Chem. Soc., 70: 1948; 2439 (reduction of isothiourea); Chem. Ber.; GE; 93; 2604–2612 (reacting halogenated alkyl at the molecular end with thiourea); and Tetrahedron Lett.: EN; 35; 12; 1837–1840 (reacting a C=C double bond of the end group with triphenylsilanethiol).

Next, particles used in the invention will be explained.

Particles

As the particles, particles of a metal, an inorganic oxide, an inorganic nitride or polymers are used, and metal particles are preferably used. Examples of the metal for the metal particles include platinum, gold, silver, nickel, chromium, copper, iron, tin, tantalum, indium, cobalt, palladium, tellurium, rhenium, iridium, aluminum, ruthenium, germanium, molybdenum, tungsten, and zinc. The metals are preferably platinum, gold, silver, copper, cobalt, chromium, iridium, nickel, palladium, molybdenum, and tungsten, each of which has a work function of not less than 4.5 eV.

Methods for preparing such metal particles include a physical preparation method such as a gas vaporization method, a sputtering method, or a metallic vapor preparation method and a chemical preparation method such as a colloid method or a co-precipitation method in which metal ions are reduced in a liquid phase to produce metal particles. The methods are preferably a colloid method disclosed in Japanese Patent O.P.I. Publication Nos. 11-76800, 11-80647, 11-319538, and 2000-239853, or a gas vaporization method disclosed in Japanese Patent O.P.I. Publication Nos. 2001-254185, 2001-53028, 2001-35255, 2001-124157 and 2000-123634.

The inorganic oxide particles include particles of silicon oxide, titanium oxide, and aluminum oxide. The inorganic oxide particles may be in the form of sol.

The size of the particles may be arbitrary, but is from 0.1 nm to 1 µm, and preferably from 1 to 100 nm. The particles preferably have a smooth surface, in effectively functioning as a semiconductor. The size of the particles herein referred to implies that when the particles are spherical, the size is a diameter of the particles and when the particles are in the form other than spheres, the size is a diameter of a circle having the same area as the projected image of the particles.

In the invention, the semiconductor channel comprises metal particles and an organic semiconducting compound combined with the particles. The metal particle content of the semiconductor channel varies due to kinds of metals used, but is ordinarily 30 to 5000 parts by weight based on the 100 parts by weight of the organic semiconducting compound.

Next, an organic semiconductor layer, a gate electrode, a source electrode, a drain electrode, a gate insulation layer, and a support, and an organic semiconductor element and organic thin-film transistor employing these will be explained.

Organic Semiconductor Layer

In the invention, the organic semiconductor layer is formed from the organic semiconductor composition above. In the invention, the organic semiconductor layer may be subjected to doping treatment. The doping herein means that an electron accepting molecule (acceptor) or an electron donating molecule (donor) is incorporated in the organic semiconductor layer as a dopant. Accordingly, the layer, which has been subjected to doping, is one which comprises the condensed polycyclic aromatic compounds and the dopant.

Employed as the dopant used in the present invention may be either acceptor or donor.

Examples of the acceptor include halogens such as $Cl_2$, $Br_2$, $I_2$, ICl, $ICl_3$, IBr, and IF; Lewis acids such as $PF_5$, $AsF_5$, $SbF_5$, $BF_3$, $BCl_3$, $BBr_3$, and $SO_3$; protonic acids such as HF, HCl, $HNO_3$, $H_2SO_4$, $HClO_4$, $FSO_3H$, $ClSO_3H$, and $CF_3SO_3H$; organic acids such as acetic acid, formic acid, and amino acid; transition metal compounds such as $FeCl_3$, FeOCl, $TiCl_4$, $ZrCl_4$, $HfCl_4$, $NbF_5$, $NbF_5$, $NbCl_5$, $TaCl_5$, $MoCl_5$, $WF_5$, $WCl_5$, $UF_6$, $LnCl_3$ (Ln=lanthanoid such as La, Ce, Nd, and Pr, and Y), and electrolyte anions such as $Cl^-$, $Br^-$, $I^-$, $ClO^{4-}$, $PF^{6-}$, $AsF^{5-}$, $SbF^{6-}$, $BF^{4-}$, and a sulfonate anion.

Examples of the donor include alkali metals such as Li, Na, K, Rb, and Cs; alkaline earth metals such as Ca, Sr, and Ba; rare earth metals such as Y, La, Ce, Pr, Nd, Sm, Eu, Gd, Tb, Dy, Ho, Er, and Yb; an ammonium ion; $R_4P^+$, $R_4AS^+$, and $R_3S^+$; and acetylcholine.

Doping these dopants may be carried out employing either a method in which the dopants are incorporated into an organic semiconductor layer having been formed, or a method in which the dopants are incorporated into an organic semiconductor layer while the layer is formed. The former methods include a gas phase doping in which gaseous dopants are employed, a liquid phase doping in which doping is carried out while the layer is brought into contact with a dopant solution or a liquid dopant, and a solid phase doping in which diffusion doping is carried out while the layer is brought into contact with a solid dopant so that the dopant diffuse into the layer.

In the liquid phase doping, it is possible to adjust the doping efficiency by means of electrolysis. In the latter method, a solution or a dispersion each containing an organic semiconductor material and a dopant may be coated and subsequently dried. For instance, when a vacuum deposition method is used, dopants may be incorporated in the layer by co-deposition of an organic semiconductor material and a dopant. Further, when the layer is formed employing a sputtering method, sputtering is carried out utilizing the two targets of an organic semiconductor material and a dopant, whereby the dopant can be incorporated in the layer. Still further, as other methods, it is possible to use any of chemical doping such as electrochemical doping or photo-initiation doping, or physical doping such as an ion injection method as shown in, for example, a publication "Kogyo Zairyo", Volume 34, No. 4, page 55 (1986).

Figure 2:
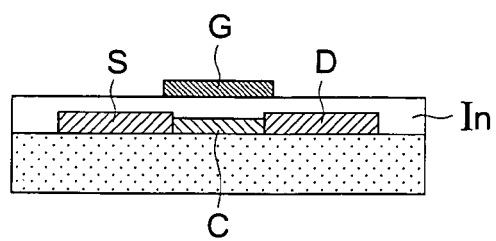
FIG. 2 shows one embodiment of the organic thin-film transistor of the invention.

The methods for forming the organic semiconductor layer include a spray coating method, a spin coating method, a blade coating method, a dip coating method, a casting method, a roll coating method, an bar coating method, and a die coating method. A coating liquid used for forming the organic semiconductor layer is a dispersion in which the organic semiconducting composition of the invention is dispersed in an organic solvent. The organic solvent is appropriately selected from various organic solvents such as hydrocarbons, an alcohol solvent, an ether solvent, an ester solvent, a ketone solvent, and a glycol ether solvent, according to the organic semi-conductor compounds used. THF, acetone, MEK, cyclohexanone, xylene, toluene, hexane, tridecane, α-terpineol, methylene chloride, or chloroform is preferably used. Further, the organic semiconductor layer can be formed according to an ink jet method in which an organic solvent solution of the organic semiconductor composition is jetted. According to this method, an organic semiconductor layer C can be effectively formed minimizing energy loss in a groove between a source electrode S and a drain electrode D as shown in FIG. 2 illustrated later.

The thickness of the organic semiconductor layer is preferably from 5 nm to 1 μm, and more preferably from 10 to 100 nm.

Electrodes

When the semiconductor element of the invention is applied to an organic thin-film transistor, a gate electrode a source electrode and a drain electrode are necessary as the electrodes. As materials for the gate electrode, the source electrode and the drain electrode, conventional materials used in the organic thin-film transistor can be employed. Employed as the materials are platinum, gold, silver, nickel, chromium, copper, iron, tin, antimony, lead, tantalum, indium, palladium, tellurium, rhenium, iridium, aluminum, ruthenium, germanium, molybdenum, tungsten, tin oxide-antimony, indium oxide-tin (ITO), fluorine-doped zinc oxide, zinc, carbon, graphite, glassy carbon, silver paste as well as carbon paste, lithium, beryllium, sodium, magnesium, potassium, calcium, scandium, titanium, manganese, zirconium, gallium, niobium, sodium, sodium-potassium alloy, magnesium, lithium, aluminum, magnesium/copper mixtures, magnesium/silver mixtures, magnesium/aluminum mixtures, magnesium/indium mixtures, aluminum/aluminum oxide mixtures, and lithium/aluminum mixtures. Of theses, specifically preferred are platinum, gold, silver, copper, aluminum, indium, and ITO. Electrically conductive polymers known in the art are suitably employed, which include electrically conductive polyaniline, electrically conductive polypyrrole, electrically conductive polythiophene, and a complex of polyethylenedioxythiophene and polystyrene sulfonic acid, which increase electrical conductivity upon being doped. Materials for the source and drain electrodes are preferably those which provide a low electric resistance at the electrode surface contacting the organic semi-conductor layer.

In order to use the semiconductor element of the invention as a photosensor, at least two electrodes are necessary. As the electrodes for the photosensor, those denoted in the gate electrode, source electrode and drain electrode above can be used.

Methods for forming the electrode include a method in which a photolithographic method or a lift-off method, known in the art, is applied to an electrically conductive layer of the materials described above, which has been formed employing a vacuum deposition method or a sputtering method, and a method in which a resist layer is subjected to etching which has been prepared employing thermal transfer or ink jet printing onto a foil of metal such as aluminum or copper. Further, an electrically conductive polymer solution or dispersion, or a minute electrically conductive particle dispersion may be subjected directly to patterning, employing ink jet printing to obtain an electrode. An electrode may also be formed in such a manner that a coated layer is subjected to lithography or laser ablation. In addition, a method may also be employed in which ink comprising either an electrically conductive polymer or minute electrically conductive particles, or electrically conductive paste is subjected to patterning, employing any of the printing methods such as letter press, intaglio printing, lithography, or screen printing.

When a TFT sheet is prepared, a gate busline, a source busline, and a display electrode are provided, and those described above apply to materials for the TFT sheet or a formation method of the TFT sheet.

Gate Insulation Layer

When the semiconductor element of the invention is applied to an organic thin-film transistor, a gate insulation layer is provided. Various insulation layers may be employed as the gate insulation layer. The insulation layer is preferably a layer comprised of an inorganic oxide with high dielectric constant. Examples of the inorganic oxide include silicon oxide, aluminum oxide, tantalum oxide, titanium oxide, tin oxide, vanadium oxide, barium strontium titanate, barium zirconate titanate, zirconic acid lead carbonate, lead lanthanum titanate, strontium titanate, barium titanate, barium magnesium fluoride, bismuth titanate, strontium bismuth titanate, strontium bismuth tantalate, bismuth niobate tantalate, and yttrium trioxide. Of these, silicon oxide, silicon nitride, aluminum oxide, tantalum oxide or titanium oxide is particularly preferred. An inorganic nitride such as silicon nitride or aluminum nitride can be also suitably used.

The methods for forming the above layer include a dry process such as a vacuum deposition method, a molecular beam epitaxial growth method, an ion cluster beam method, a low energy ion beam method, an ion plating method, a CVD method, a sputtering method, or a plasma method, a wet process such as a spray coating method, a spin coating method, a blade coating method, a dip coating method, a casting method, a roll coating method, an bar coating method, or a die coating method, and a patterning method such as a printing method or an ink-jet method. These methods can be used due to kinds of materials used in the insulation layer. As the typical wet process can be used a method of coating a dispersion liquid and drying, the liquid being obtained by dispersing inorganic oxide particles in an organic solvent or water optionally in the presence of a dispersant such as a surfactant, or a so-called sol gel method of coating a solution of an oxide precursor such as an alkoxide and drying. With respect to an aluminum oxide layer or a tantalum oxide layer, a known anodization method can be applied. Among the above, the preferred are an atmospheric pressure plasma method and an anodization method.

A method of forming an insulation layer according to the plasma layer formation method at atmospheric pressure will be explained below.

The plasma layer formation method at atmospheric pressure means a method wherein a reactive gas is plasma-excited by discharge conducted at atmospheric pressure or at approximately atmospheric pressure, whereby a thin-film is formed on a support. The method is described in Japanese Patent O.P.I. Publication Nos. 11-133205, 2000-185362, 11-61406, 2000-147209 and 2000-121804. This method can form a thin film having high performance at high productivity.

Examples of the organic compound used in an organic compound layer include polyimide, polyamide, polyester, polyacrylate, a photo-curable resin such as a photo-radical polymerizable or photo-cation polymerizable resin, a copolymer containing an acrylonitrile unit, polyvinyl phenol, polyvinyl alcohol, novolak resin, cyanoethylpullulan, and a phosphazene compound including its polymeric or elastic substance.

As a method of forming the organic compound layer, the wet process described above is preferably used.

An inorganic oxide layer and an organic oxide layer can be used in combination and superposed. The thickness of the insulation layer is generally 50 nm to 3 μm, and preferably 100 nm to 1 μm.

Support

A support is comprised of glass or a flexible resin sheet. For example, it is possible to use a plastic film as the sheet. Examples of the plastic film include films comprised of, for example, polyethylene terephthalate (PET), polyethylene naphthalate (PEN), polyethersulfone (PES), polyetherimide, polyether ether ketone, polyphenylene sulfide, polyallylate, polyimide, polycarbonate (PC), cellulose triacetate (TAC), or cellulose acetate propionate (CAP). Use of the plastic film makes it possible to decrease weight, to enhance portability, and to enhance durability against impact due to its flexibility, as compared to glass.

When the organic semiconductor layer or the gate insulation layer is a polymer film, which serves also as support, and therefore is self-supporting, another support is not essential.

Protective Layer or Others)

The semiconductor element of the invention is preferably protected by a protective layer in order to prevent its life from decreasing due to oxygen or moisture in atmosphere. Examples of the protective layer include a gas-barrier layer comprised of polyvinyl alcohol or ethylene-vinyl alcohol copolymer and a layer comprised of the inorganic compounds described in the gate insulation layer above. These protective layers serve also as a functional layer such as antireflection layer.

Layer Structure of Semiconductor Element

Figure 3:
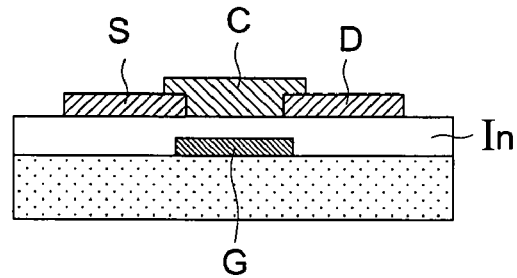
FIG. 3 shows another embodiment of the organic thin-film transistor of the invention.
Figure 4:
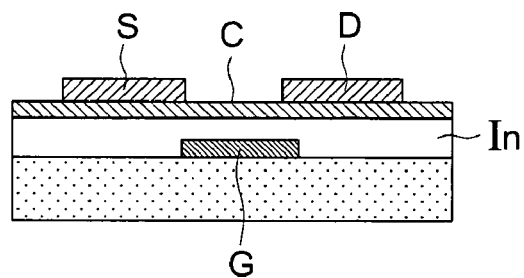
FIG. 4 shows still another embodiment of the organic thin-film transistor of the invention.

When the semiconductor element is an organic thin-film transistor, its layer structure is shown in FIGS. 2, 3, and 4. The organic thin-film transistor comprises a gate electrode, a gate insulation layer, a semiconductor layer adjacent to the gate insulation layer, and a source electrode and a drain electrode each contacting the semiconductor layer. In the these figures, "S", "D", "G", "C", and "In" represent a source electrode, a drain electrode, a gate electrode, a semiconductor layer containing an organic semiconductor composition and a gate insulation layer, respectively. The formation method of each electrode may be any one of those described above. The semiconductor layer in FIG. 2, 3 or 4 containing an organic semiconductor composition is preferably formed according to the ink jet method or the coating method described above.

Layer Structure of Photosensor

Figure 6:
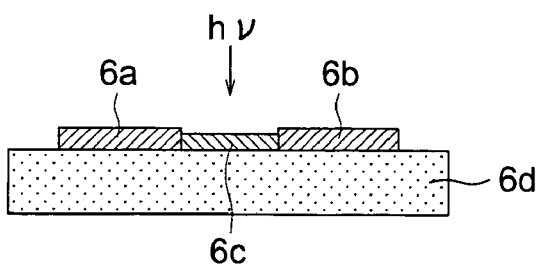
FIG. 6 shows one embodiment of the photosensor in the invention.
Figure 7:
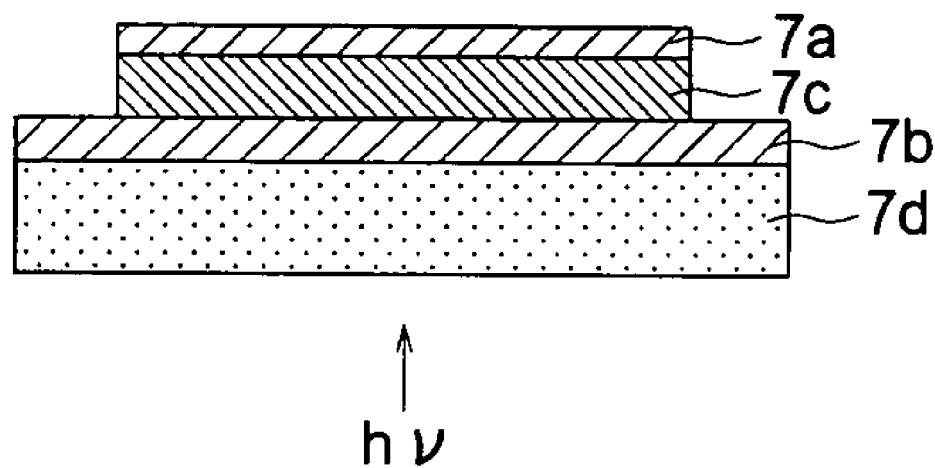
FIG. 7 shows another embodiment of the photosensor in the invention.

When the semiconductor element is a photosensor, its layer structure is shown in FIG. 6 or 7. Numerical numbers 6a, 6b, 7a, and 7b represent electrodes; numerical numbers 6c and 7c represent photoelectric conversion layers; and numerical numbers 6d and 7d represent supports. FIG. 7 shows a transparent electrode in which an ITO (indium tin oxide) layer is provided as an electrode 7b on a transparent support.

Figure 9:
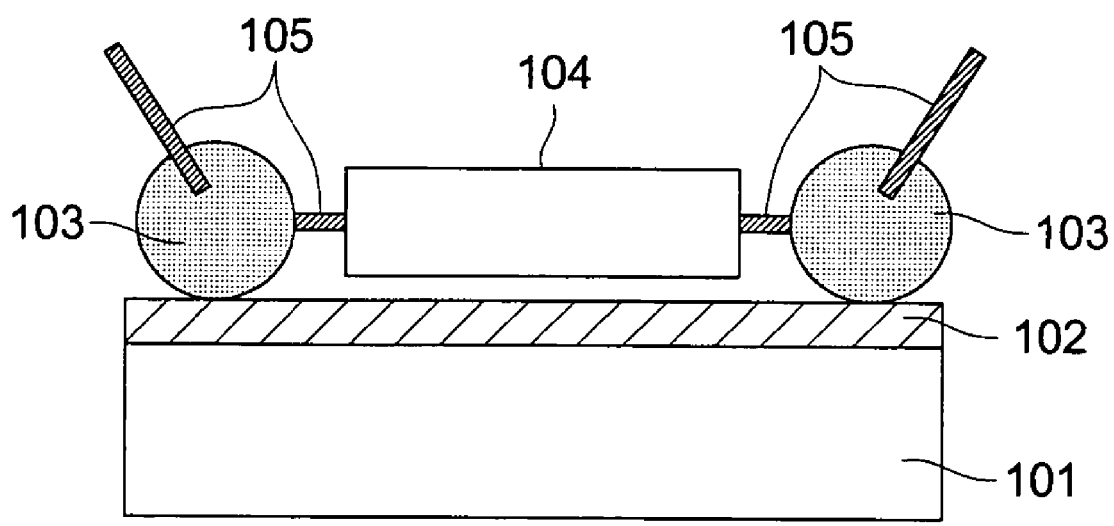
FIG. 9 shows a schematic view of a transistor having the constitution in which the organic semiconducting compound combines with particles at each end of the molecule.

A transistor, having a structure as shown in FIG. 9, can be prepared employing the organic semiconductor composition of the invention. FIG. 9 shows a structure in which a gate insulation layer 102 is provided on a gate electrode 101, and an organic semiconducting compound 104 is provided on the gate insulation layer, the organic semiconducting compound combining with two metal (for example, gold) particles 103 through at least two of a linkage group (for example, thiol) 105, and each metal particle functioning as a source electrode and a drain electrode. When each metal particle of the transistor is combined with a carbon nanotube or an SPM probe, transistor properties are obtained.

EXAMPLES

Example 1

Preparation of Dispersion Sample 1

Dimethylethanolamine was added little by little to an aqueous solution with stirring, and the resulting mixture colored red. Thus, a gold particle dispersion liquid was obtained. A chloroform solution of hexylthiophene (Exemplified compound 1) having a mercapto group in the molecular end was added to the dispersion liquid, and vigorously stirred. The chloroform phase of the resulting mixture was purified, and an inventive chloroform dispersion liquid sample (dispersion sample 1) was obtained. It has been confirmed according to TEM observation that gold particles with a particle diameter of about 20 nm were well dispersed in the dispersion liquid.

Preparation of Dispersion Sample 2

A sample was prepared in the same manner as in dispersion sample 1 above, except that sexihexylthiophene (Exemplified compound 3) having a mercapto group in the molecular both ends was used as the semiconductor compound instead of sexihexylthiophene having a mercapto group in the molecular end. Thus, a viscous chloroform dispersion liquid sample (dispersion sample 2) was obtained.

Preparation of Dispersion Sample 3

A sample was prepared in the same manner as in dispersion sample 1 above, except that Exemplified compound 2 was used as the semiconductor compound instead of Exemplified compound 1. Thus, a chloroform dispersion liquid sample was obtained. This sample and dispersion sample 1 prepared above were mixed in a mixing ratio by weight of 1:1, and the resulting mixture was sufficiently purified. Thus, an inventive mixed chloroform dispersion liquid sample (dispersion sample 3) was obtained.

Preparation of Dispersion Sample 4

Diethanolamine was added little by little to an aqueous chloroauric acid solution with stirring, and the resulting mixture colored red. Thus, a gold particle dispersion liquid was obtained. A methylene chloride solution of a mixture of Exemplified compound 4 and Exemplified compound 5 (1:1 by weight) was added to the dispersion liquid, and vigorously stirred. The methylene chloride phase of the resulting mixture was purified, and an inventive methylene chloride dispersion liquid sample (dispersion a) was obtained. A methylene chloride dispersion liquid sample (dispersion b) was obtained in the same manner as above, except that a mixture of Exemplified compound 6 and Exemplified compound 7 (1:1 by weight) was used as the semiconductor compound instead of the mixture of Exemplified compound 4 and Exemplified compound 5 (1:1). Dispersion a and dispersion b (1:1 by weight ratio) were mixed. Thus, a mixed dispersion liquid sample (dispersion 4) was obtained.

Preparation of Dispersion Sample 5

A sample was prepared in the same manner as in dispersion sample 4 above, except that chloroplatinic acid was used instead of chloroauric acid. Thus, a mixed dispersion liquid sample (dispersion sample 5) was obtained.

Each of the above obtained dispersions was coated on a glass plate and dried. A dispersion layer of hexagonal packing particles was formed on the glass plate. In the layer photoelectric current was observed according to a TOF method, and it has been confirmed that the layer efficiently functions as an organic semiconductor layer. No dark current was observed. The electric conductivity of the layer was not more than $1 \times 10^{-6}$ S/cm.

Example 2

A 200 Å thick Au layer was deposited on a 150 µm thick polyimide film, and a source electrode and a drain electrode were formed according to photolithography. A semiconductor channel comprising an organic semiconductor composition (dispersion sample 1) had a length of 20 µm, and a thickness of about 50 nm. After the resulting material was allowed to stand in an ammonia gas atmosphere for 5 hours, a 300 nm thick gate insulation layer comprised silicon oxide is formed on the source electrode, drain electrode and semiconductor channel layer according to the atmospheric pressure plasma method described above. The gate insulation layer with compactness was obtained with good adhesion to the semiconductor channel layer. Subsequently, a 30 µm wide gate electrode was formed employing silver paste available on the market. Thus, an organic thin-film transistor (an organic thin-film transistor sample 1) as shown in FIG. 2 was prepared.

Organic thin-film transistor samples 2 through 5 were prepared in the same manner as in organic thin-film transistor sample 1, except that dispersion samples 2 through 5 were used instead of dispersion sample 1.

Figure 5:
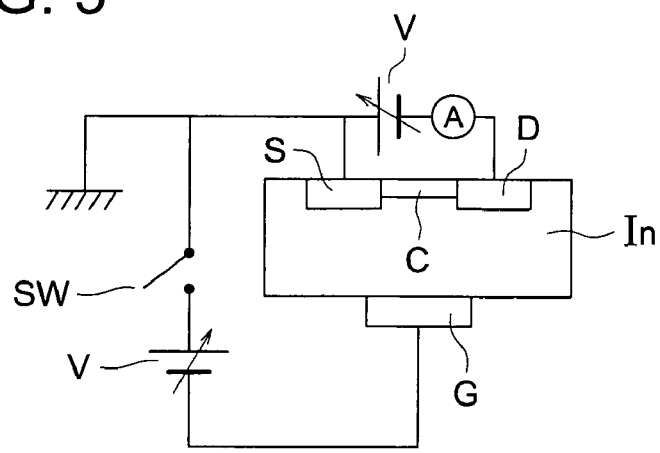
FIG. 5 shows one embodiment of a measurement circuit for evaluation.

A transistor property of each of the organic thin-film transistor samples 1 through 5 was measured under atmospheric pressure. A circuit for measurement is shown in FIG. 5. In FIG. 5, "S", "D", "G", "C", "In", "A", "V", and "SW" represent a source electrode, a drain electrode, a gate electrode, a semiconductor layer containing an organic semiconductor composition, a gate insulation layer, an ammeter, a variable bias, and a switch, respectively. All the organic thin-film transistor samples exhibited a good transistor property, and provided a FET property of the p-channel enhancement type.

Example 3

A 2000 Å thick oxide layer was formed on an Si wafer having a specific resistance of 0.02 Ω·cm, washed with ultra pure water, and dispersion 1 was coated on the resulting oxide layer employing an applicator, and dried to obtain a cast layer (with a thickness of about 70 nm). A gold layer was deposited onto the cast layer employing a mask to form a source electrode, a drain electrode, and a channel with a width W of 3 mm and a length L of 20 µm. Thus, organic thin-film transistor having a structure as shown in FIG. 4 was prepared.

Figure 10:
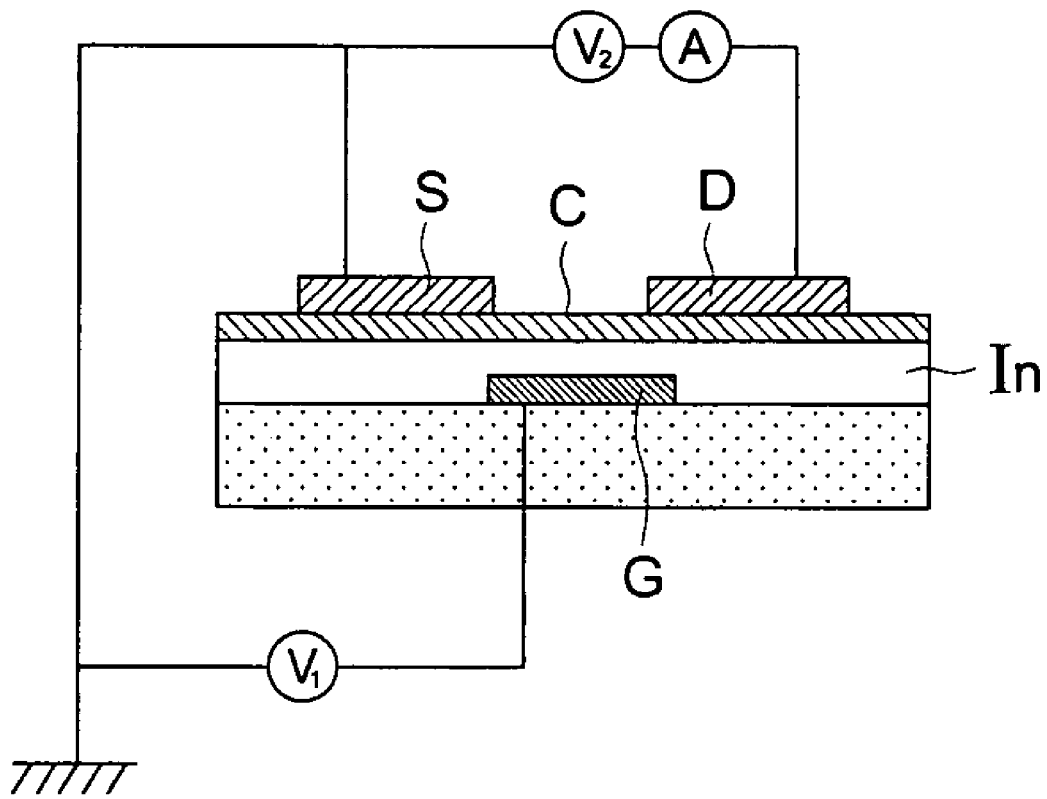
FIG. 10 shows another embodiment of a measurement circuit for evaluation.

The static property of the transistor was measured employing a circuit as shown in FIG. 10, and evaluated. As a result, the transistor provided a FET property of the p-channel enhancement type. A carrier mobility at the saturated region was 0.08. In FIG. 10, "S", "D", "G", "C", "In", "A", "$V_1$", and "$V_2$" represent a source electrode, a drain electrode, a gate electrode, a semiconductor layer containing an organic semiconductor composition, a gate insulation layer, an ammeter, a gate bias, and a source drain bias, respectively.

Example 4

An organic thin-film transistor was prepared in the same manner as in Example 3 above, except that dispersion 3 was used, and evaluated in the same manner as in Example 3 above. A carrier mobility at the saturated region was 0.11.

Example 5

Dimethylethanolamine was added little by little to an aqueous chloroauric acid solution with stirring, and the resulting mixture colored red. Thus, a gold particle dispersion liquid was obtained. A methanol solution of porphyrin compound, Compound P-1 was added to the dispersion liquid, vigorously stirred, and subjected to centrifugal separation to separate the particles. The separated particles were added to a chloroform solution of polyporphyrin P-2 and stirred vigorously. Thus, inventive dispersion was obtained. An organic thin-film transistor having a structure as shown in FIG. 4 was prepared in the same manner as in Example 3, except that this dispersion was used.

The static property of this transistor was measured employing a circuit as shown in FIG. 10, and evaluated. As a result, the transistor provided a FET property of the p-channel enhancement type. A carrier mobility at the saturated region was 0.05.

Comparative Example

A chloroform solution 1 of regioregular poly(3-hexylthiophene) (produced by Ardrich Co., Ltd.) was prepared, and purified so that a content of Zn or Ni was not more than 10 ppm, according to a chelating method employing EDTA.

A 2000 Å thick oxide layer was formed on an Si wafer having a specific resistance of 0.02 Ω·cm, and the above-obtained chloroform solution 1 was coated on the resulting oxide layer employing an applicator, and dried to obtain a cast layer (with a thickness of about 70 nm). A gold layer was deposited onto the cast layer employing a mask to form a source electrode, a drain electrode, and a channel with a width W of 3 mm and a length L of 20 µm. Thus, organic thin-film transistor having a structure as shown in FIG. 4 was prepared.

The static property of this transistor was evaluated in the same manner as in Example 3. As a result, a carrier mobility at the saturated region was 0.007.

The invention can provide an organic semiconductor composition which can provide a layer with high mobility capable of being formed by a simple procedure without an orientation process such as an orientation film formation, and provide a semiconductor element such as an organic thin-film transistor or a photosensor, each employing the organic semiconductor composition.

What is claimed is:

1. An organic semiconductor composition comprising:
   particles of a metal, an inorganic oxide, an inorganic nitride or polymers, and
   an organic semiconducting compound having a substituent on at least one end of the compound, the compound chemically combined with the particles through the substituent,
   wherein the organic semiconducting compound is a π-conjugated polymer or oligomer.

2. The organic semiconductor composition of claim 1, wherein the particles are the metal particles.

3. The organic semiconductor composition of claim 1, wherein the substituent is a sulfide group, a disulfide group, a carboxyl group, a sulfonic acid group, a sulfinic acid group, a phosphoric acid group, or a phosphate group.

4. The organic semiconductor composition of claim 3, wherein substituent is a sulfide group.

5. The organic semiconductor composition of claim 1, wherein the π-conjugated polymer or oligomer is a polythiophene derivative.

6. The organic semiconductor composition of claim 5, wherein the polythiophene derivative is a regioregular poly(3-alkylthiophene).

7. The organic semiconductor composition of claim 6, wherein the alkyl group of the regioregular poly(3-alkylthiophene) is an alkyl group having a carbon atom number of from 4 to 15.

8. The organic semiconductor composition of claim 6, wherein the regioregular poly(3-alkylthiophene) is chemically combined with the particles is dispersed in a solvent.

9. The organic semiconductor composition of claim 6, wherein the solvent can dissolve the regioregular poly(3-alkylthiophene).

10. The organic semiconductor composition of claim 6, wherein the regioregular poly(3-alkylthiophene) chemically combined with the particles is a mixture of first particles, with which poly (5-substituted 3-alkylthiophene) is chemically combined through the substituent of the 5-position, and second particles, with which poly(2-substituted 3-alkylthiophene) is chemically combined through the substituent of the 2-position.

11. The organic semiconductor composition of claim 10, wherein the first particles, with which poly(5-substituted 3-alkylthiophene) is chemically combined through the substituent of the 5-position, are dispersed in a first solvent to obtain a first dispersion, second particles, with which poly (2-substituted 3-alkylthiophene) is chemically combined through the substituent of the 2-position, are dispersed in a second solvent to obtain a second dispersion, and both dispersions are mixed.

12. The organic semiconductor composition of claim 1, wherein the π-conjugated polymer or oligomer is a polyporphyrin derivative.

13. The organic semiconductor composition of claim 12, wherein the polyporphyrin derivative is poly(imidazolylporphyrin-metal complex).

* * * * *